United States Patent
Moriyama et al.

(10) Patent No.: US 8,941,908 B2
(45) Date of Patent: Jan. 27, 2015

(54) POROUS ELECTRODE SHEET, METHOD FOR PRODUCING THE SAME, AND DISPLAY DEVICE

(75) Inventors: Junichi Moriyama, Osaka (JP); Yozo Nagai, Osaka (JP); Satoru Furuyama, Osaka (JP); Hajime Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/988,978

(22) PCT Filed: Dec. 15, 2011

(86) PCT No.: PCT/JP2011/007018
§ 371 (c)(1),
(2), (4) Date: May 22, 2013

(87) PCT Pub. No.: WO2012/090414
PCT Pub. Date: Jul. 5, 2012

(65) Prior Publication Data
US 2013/0286460 A1  Oct. 31, 2013

(30) Foreign Application Priority Data

Dec. 28, 2010 (JP) .................................. 2010-292285

(51) Int. Cl.
*G02F 1/15* (2006.01)
*H05K 1/03* (2006.01)
*G02F 1/155* (2006.01)
*H05K 1/09* (2006.01)
*H05K 13/00* (2006.01)
*B32B 17/10* (2006.01)

(52) U.S. Cl.
CPC .............. *H05K 1/0306* (2013.01); *G02F 1/155* (2013.01); *H05K 1/09* (2013.01); *H05K 13/00* (2013.01); *G02F 2001/1552* (2013.01); *B32B 17/10036* (2013.01); *B32B 2001/1536* (2013.01)
USPC .......................................... 359/265; 359/267

(58) Field of Classification Search
CPC ....... B60R 1/088; C08I 63/00; H05K 1/0313; H01L 2224/16225; H01L 2224/32225
USPC ................... 359/265–275; 345/105; 174/258; 361/748

See application file for complete search history.

(56) References Cited

U.S. PATENT DOCUMENTS

| 4,203,106 A | 5/1980 | Dalisa et al. |
| 6,597,489 B1 * | 7/2003 | Guarr et al. .................... 359/266 |
| 7,800,807 B2 | 9/2010 | Nakaho et al. |
| 7,903,314 B2 | 3/2011 | Nakaho et al. |
| 2012/0212793 A1 * | 8/2012 | Andersson Ersman et al. ............................ 359/268 |

FOREIGN PATENT DOCUMENTS

| CA | 802678 | 12/1968 |
| JP | 54-085699 | 7/1979 |

(Continued)

*Primary Examiner* — Tuyen Tra
(74) *Attorney, Agent, or Firm* — Hamre, Schumann, Mueller & Larson, P.C.

(57) ABSTRACT

A porous electrode sheet (1) includes a resin film (2) being transparent and having insulating properties, and a transparent electrode (3) placed on one face (2*a*) of the resin film (2). The resin film (2) is provided with a plurality of through holes (21) extending linearly from the one face (2*a*) to the other face (2*b*). The transparent electrode (3) has openings (31) at positions corresponding respectively to the through holes (21). The through holes (21) of the resin film (2) and the openings (31) of the transparent electrode (3) communicate with each other, and thereby form passages (10) penetrating the porous electrode sheet (1) in the thickness direction.

2 Claims, 4 Drawing Sheets

(56) References Cited

FOREIGN PATENT DOCUMENTS

| JP | 2009-008750 | 1/2009 |
| JP | 2009-175327 | 8/2009 |
| JP | 2010-033016 | 2/2010 |
| WO | WO 2006/045043 | 4/2006 |
| WO | 2010/126121 | 11/2010 |

* cited by examiner

POROUS ELECTRODE SHEET, METHOD FOR PRODUCING THE SAME, AND DISPLAY DEVICE

TECHNICAL FIELD

The present invention relates to a porous electrode sheet including a transparent insulating layer and a transparent electrode placed on the insulating layer, and to a method for producing the porous electrode sheet. The present invention also relates to a display device using the porous electrode sheet.

BACKGROUND ART

Conventionally, transparent electrodes have been used in various devices. A transparent electrode is generally placed on a transparent substrate or insulating layer. For example, Patent Literature 1 discloses an electrochromic multi-color display device 100 as shown in FIG. 4.

In the display device 100, a display substrate 11 and a counter electrode 12 are attached to each other via a spacer 18, and a cell is thus formed. In the cell, a first display electrode 13a, a first electrochromic layer 14a, an insulating layer 15, a second display electrode 13b, and a second electrochromic layer 14b are layered on the display substrate 11. A counter electrode 17 and a white reflective layer 16 are layered on the counter electrode 12. In addition, the inside of the cell is filled with an electrolyte 19.

The first display electrode 13a and the second display electrode 13b are transparent electrodes. The first electrochromic layer 14a is caused to produce a first color or to become colorless by control of the voltage applied between the first display electrode 13a and the counter electrode 17. The second electrochromic layer 14b is caused to produce a second color different from the first color or to become colorless by control of the voltage applied between the second display electrode 13b and the counter electrode 17.

The first electrochromic layer 14a and the second electrochromic layer 14b generally have a structure in which an electrochromic compound is supported on a metal oxide. The metal oxide used has conducting properties in some cases. The insulating layer 15 is intended to allow separate control of the potential of the first display electrode 13a and the potential of the second display electrode 13b. In addition, the insulating layer 15 is transparent, and is porous in order that the electrolyte 19 permeates into the insulating layer 15 so as to allow ion transfer associated with oxidation-reduction reaction.

CITATION LIST

Patent Literature

Patent Literature 1: JP 2010-33016 A

SUMMARY OF INVENTION

Technical Problem

Patent Literature 1 describes sputtering with an inorganic material containing ZnS as a specific method for forming the insulating layer 15 which is porous. However, in the case where the insulating layer 15 is formed by sputtering, it is difficult to make the thickness of the insulating layer 15 uniform over a wide area. If the thickness of the insulating layer 15 lacks uniformity, the insulating properties are deteriorated at a thin portion, and the transparency is reduced at a thick portion.

In view of such circumstances, the present invention aims to provide a porous electrode sheet that can have an insulating layer whose thickness is uniform along a transparent electrode, and to provide a method for producing the porous electrode sheet. The present invention also aims to provide a display device using the porous electrode sheet.

Solution to Problem

That is, the present invention provides a porous electrode sheet including: a resin film being transparent and having insulating properties, the resin film being provided with a plurality of through holes extending linearly from one face of the resin film to the other face; and a transparent electrode placed on the one face of the resin film and having openings at positions corresponding respectively to the plurality of through holes.

In addition, the present invention provides a display device including the porous electrode sheet.

Furthermore, the present invention provides a method for producing a porous electrode sheet. The method includes the steps of: forming a plurality of modified tracks by irradiating a resin base material that is transparent and imperforate with an ion beam so that the plurality of modified tracks extend in such a way as to penetrate the resin base material in a thickness direction; obtaining a resin film having a plurality of through holes by subjecting the resin base material to chemical etching using the modified tracks as base points; and forming, on one face of the resin film, a transparent electrode having openings at positions corresponding respectively to the plurality of through holes.

Advantageous Effects of Invention

In the above configuration, the transparent electrode is placed on the one face of the resin film. The resin film can easily be fabricated to have a uniform thickness over a wide area. Therefore, the use of the resin film can ensure an insulating layer whose thickness is uniform along the transparent electrode. Furthermore, in the porous electrode sheet of the present invention, passages penetrating the porous electrode sheet in the thickness direction are formed by the through holes of the resin film and the openings of the transparent electrode. Therefore, even in the case where, for example, the insulating layer is disposed in contact with an electrochromic layer, ions can move through the passages.

The conventional insulating layer contacting an electrochromic layer is a porous layer whose pores have no directionality. Therefore, ions cannot move in the insulating layer smoothly. By contrast, in the present invention, since the above-described passages allow ions to move and pass through the porous electrode sheet by the shortest route, the rate of oxidation-reduction reaction can be increased. That is, if the porous electrode sheet is used in an electrochromic display device, the performance of the display device is improved.

DESCRIPTION OF EMBODIMENTS

Hereinafter, embodiments of the present invention will be described with reference to the accompanying drawings.

<Porous Electrode Sheet>

Figure 1A:
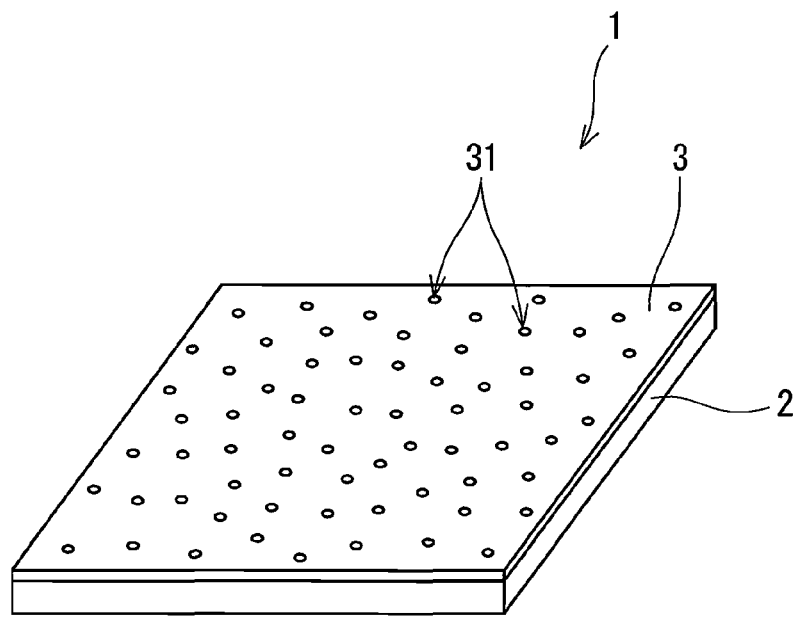
FIG. 1A is a perspective view of a porous electrode sheet according to an embodiment of the present invention.
Figure 1B:
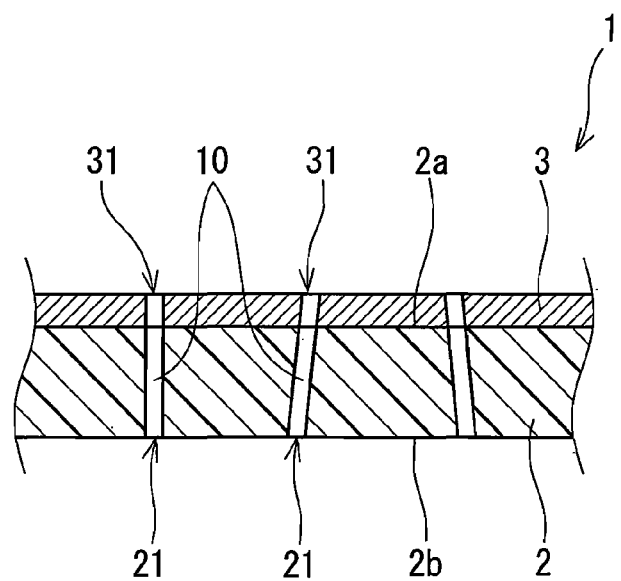
FIG. 1B is a cross-sectional view of the porous electrode sheet.

A porous electrode sheet 1 according to an embodiment of the present invention is shown in FIGS. 1A and 1B. The porous electrode sheet 1 includes a resin film 2 being transparent and having insulating properties, and a transparent electrode 3 placed on one face 2a of the resin film 2.

The resin film 2 can easily be fabricated to have a uniform thickness over a wide area. Accordingly, the porous electrode sheet 1 using the resin film 2 can have an insulating layer whose thickness is uniform along the transparent electrode 3.

The shape of the porous electrode sheet 1 is not particularly limited. For example, the shape in plan view (as viewed in the thickness direction) of the porous electrode sheet 1 may be a rectangle, a circle, or a polygon with rounded corners.

The resin film 2 is provided with a plurality of through holes 21 extending linearly from the one face 2a to the other face 2b. In other words, the through holes 21 are straight holes having no branches. The resin film 2 having such through holes 21 can be fabricated as follows: a resin base material that is transparent and imperforate is irradiated with an ion beam to form a plurality of modified tracks (linear portions formed as a result of modification of the resin) extending in such a way as to penetrate the resin base material in the thickness direction; and the resin base material is then subjected to chemical etching using the modified tracks as base points.

Products fabricated by perforation techniques using the above combination of ion beam irradiation and chemical etching are widely commercially available, and such commercially-available products (e.g., membrane filters sold by Oxyphen AG or Millipore Corporation) can be used as the resin film 2.

With an ion beam, a wide area can be irradiated in a short time at high density. In addition, the resin base material can also be irradiated with an ion beam directed at an oblique angle to the resin base material. Heavy ions are preferably used in the ion beam irradiation. This is because the use of heavy ions allows formation of extremely slender through holes 21 in which the ratio of the length to the hole diameter (a so-called aspect ratio) is 10,000 or more. For example, heavy ions can be emitted toward the resin base material after being accelerated by cyclotron.

Here, assuming that the cross-sectional shape of the through holes 21 is a circle, the "hole diameter" means the diameter of the circle. In other words, the "hole diameter" means the diameter of a circle having an area equal to the cross-sectional area of the through holes 21.

An etching liquid such as an alkali solution is used in the chemical etching for removing the resin of the modified tracks. The hole diameter and the cross-sectional shape of the through holes 21 can be controlled by the chemical etching.

The cross-sectional shape of the through holes 21 is not particularly limited, and may be a circle or an indefinite shape. The average hole diameter of the through holes 21 is preferably 0.05 μm or more and 100 μm or less. However, in the case where the porous electrode sheet 1 is disposed in contact with an electrochromic layer as described later, the maximum hole diameter of the through holes 21 is preferably smaller than the average particle diameter of a metal oxide on which an electrochromic compound is supported. The average hole diameter of the through holes 21 is more preferably 0.1 μm or more and 10 μm or less.

The density of the through holes 21 preferably falls within specified limits included in a range of 10 to $1 \times 10^8$ holes/cm$^2$ over the entire faces of the resin film 2 (e.g., the maximum density is 1.5 times or less the minimum density). The density of the through holes 21 can be adjusted depending on the number of ions applied at the time of ion beam irradiation. The density of the through holes 21 is more preferably in a range of $1 \times 10^3$ to $1 \times 10^7$ holes/cm$^2$.

The aspect ratio of the through holes 21 is preferably 5 or more.

For example, the thickness of the resin film 2 is 10 to 100 μm. Specific examples of the resin film 2 include a polyethylene terephthalate (PET) film, a polyethylene naphthalate (PEN) film, and a polycarbonate (PC) film which are transparent insulating films.

The transparent electrode 3 has openings 31 at positions corresponding respectively to the through holes 21. That is, the through holes 21 of the resin film 2 and the openings 31 of the transparent electrode 3 communicate with each other, and thereby form passages 10 penetrating the porous electrode sheet 1 in the thickness direction.

In order to form the transparent electrode 3 having the openings 31, a conductive film may be formed directly on the one face 2a of the resin film by a sputtering method, an electron beam method, an ion plating method, a vacuum evaporation method, a chemical vapor deposition method (CVD method), or the like.

The transparent electrode 3 is preferably formed of an indium tin oxide film (ITO film). However, the transparent electrode 3 may be formed of, for example, a fluorine-doped tin oxide film (FTO film), or a zinc oxide film doped with antimony, indium, or aluminum.

<Display Device>

Figure 2:
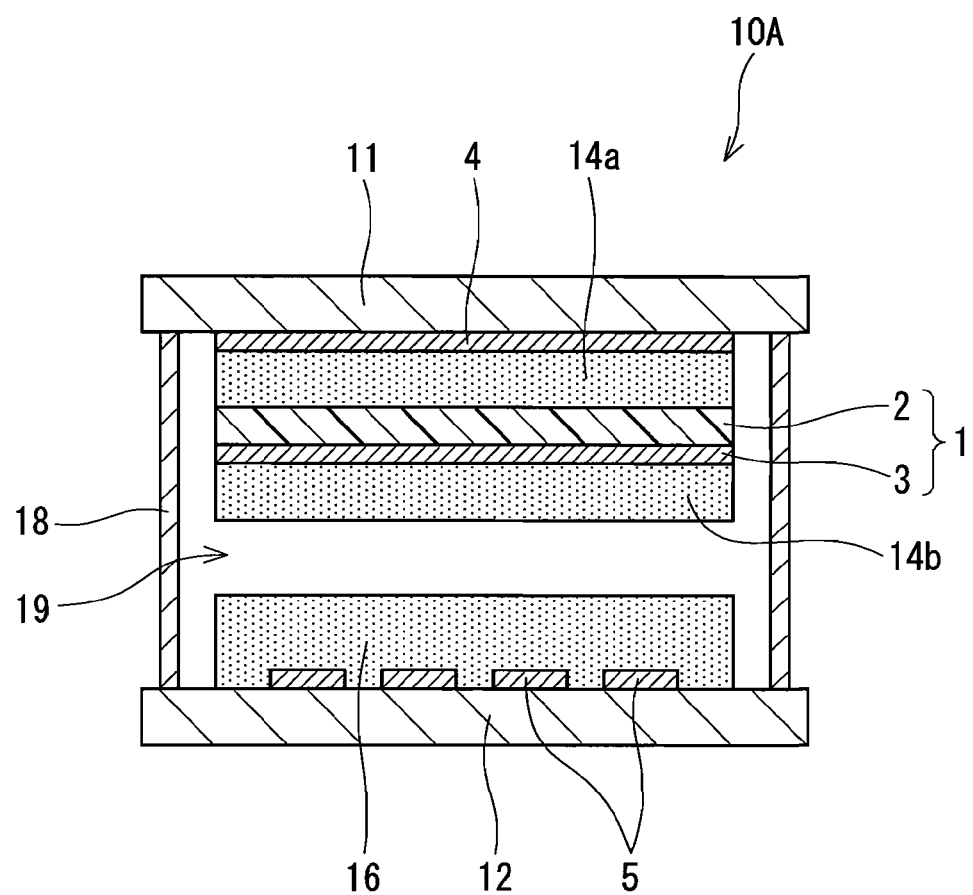
FIG. 2 is a schematic configuration diagram of a multi-color display device using the porous electrode sheet of FIGS. 1A and 1B.

Next, an example of use of the porous electrode sheet 1 of the present embodiment will be described. FIG. 2 shows an electrochromic multi-color display device 10A using the porous electrode sheet 1. The same components as those described with reference to FIG. 4 in BACKGROUND ART are denoted by the same reference characters, and the description thereof is omitted.

Figure 4:
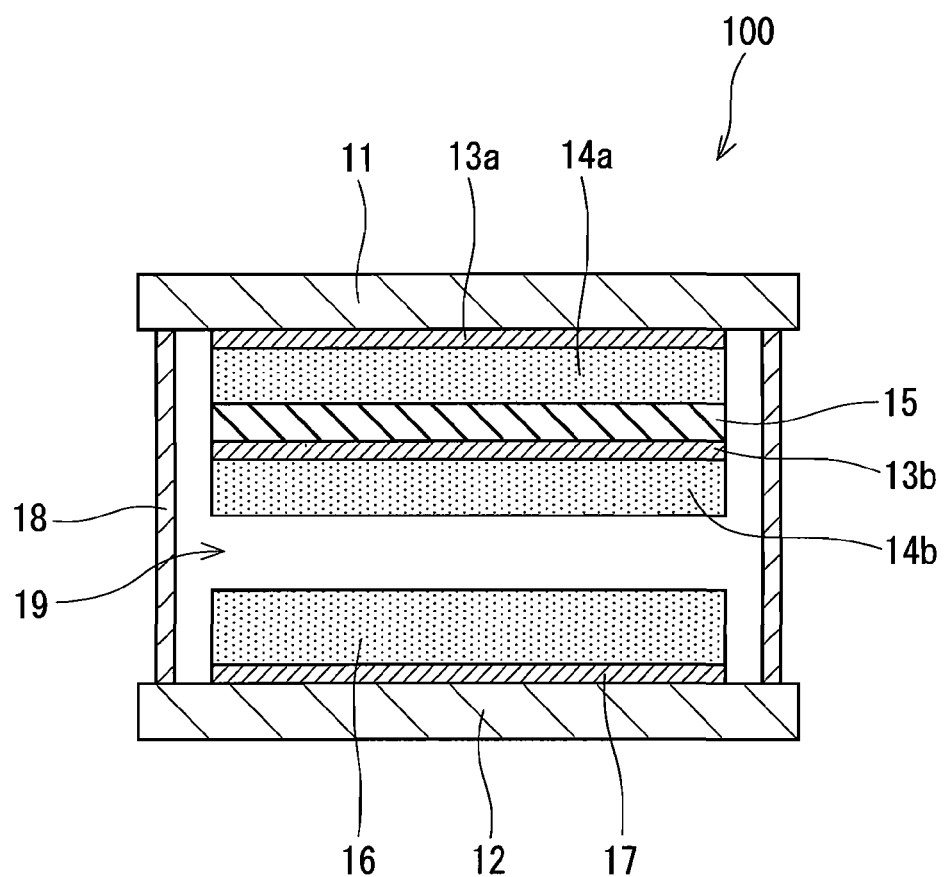
FIG. 4 is a schematic configuration diagram of a conventional display device.

In the display device 10A, a first transparent electrode 4 for operation of the first electrochromic layer 14a is provided instead of the first display electrode 13a of FIG. 4, and the porous insulating sheet 1 is provided instead of the second display electrode 13b and the insulating layer 15 of FIG. 4. That is, the porous electrode sheet 1 is disposed in such a way that the resin film 2 faces the first transparent electrode 41 across the first electrochromic layer 14a, and that the transparent electrode 3 is in contact with the second electrochromic layer 14b. The transparent electrode 3 of the porous insulating sheet 1 functions as a second transparent electrode for operation of the second electrochromic layer 14b.

Furthermore, address electrodes 5 are provided instead of the counter electrode 17 of FIG. 4. Since the inside of the cell is filled with the electrolyte 19, the address electrodes 5 face the porous electrode sheet 1 across the space filled with the electrolyte 19.

When the porous electrode sheet 1 is used in the display device 10A as describe above, since the passages 10 (see FIG.

1B) penetrating the porous electrode sheet 1 in the thickness direction are formed in the porous electrode sheet 1, ions can move through the passages 10.

In the conventional display device 100 shown in FIG. 4, the insulating layer 15 contacting the first electrochromic layer 14a is a porous layer whose pores have no directionality, and therefore, ions cannot move in the insulating layer 15 smoothly. By contrast, in the display device 10A shown in FIG. 2, since the passages 10 allow ions to move and pass through the porous electrode sheet 1 by the shortest route, the rate of oxidation-reduction reaction can be increased. That is, the performance of the display device 10A can be improved by the porous electrode sheet 1.

In addition, the resin film 2 generally exhibits an increased transparency when immersed in a liquid. Therefore, when a liquid is used as the electrolyte 19, the visibility of the display device 10A is improved. Furthermore, since such an electrolyte solution is retained in the through holes 21, the resin film 2 can maintain the transparency even when the resin film 2 undergoes a flexible motion. Therefore, the porous electrode sheet 1 is particularly suitable for uses that require flexibility such as use in an electronic paper.

Furthermore, since the surface of the resin film 2 of the porous electrode sheet 1 is flat, the adhesiveness between the surface and the electrochromic layer (particularly an metal oxide) placed on the surface is high. In addition, the shape of the through holes 21 of the resin film 2 can be maintained more stably than the shape of pores formed in a porous insulating layer made of an inorganic material. Therefore, the production yield of the display device can also be improved.

In addition, the porous electrode sheet 1 of the present embodiment can also be used for an electrochromic monochromatic display device. An example of the configuration in this case is shown in FIG. 3.

Figure 3:
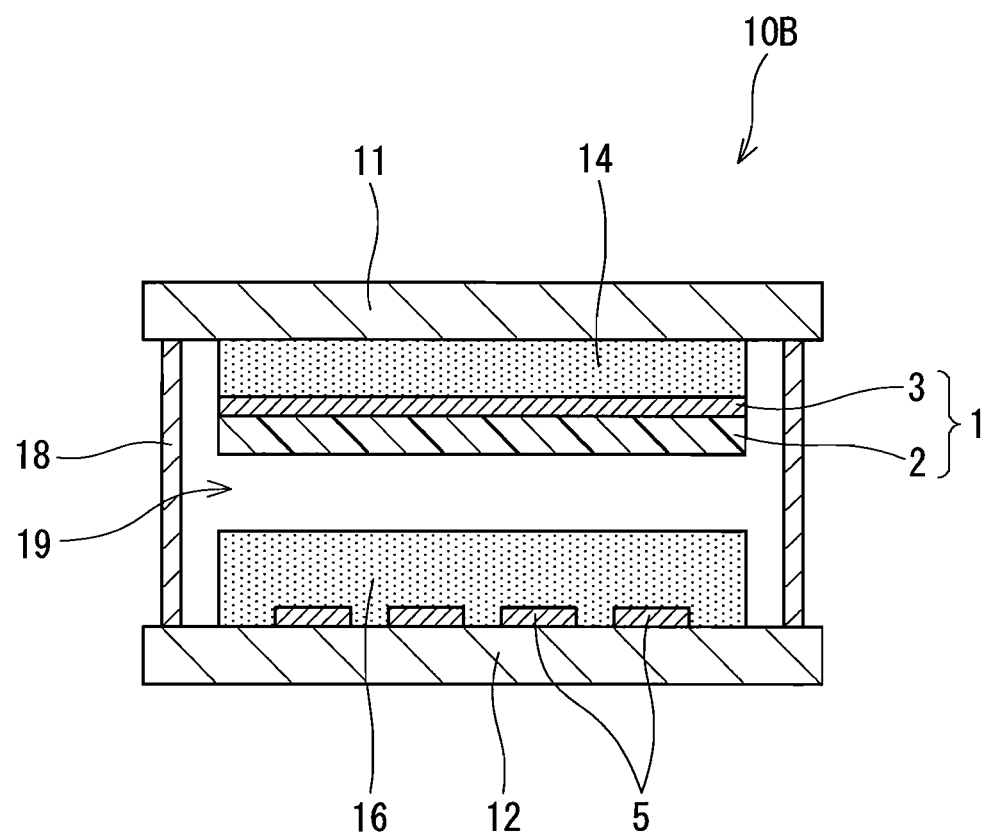
FIG. 3 is a schematic configuration diagram of a monochromatic display device using the porous electrode sheet of FIGS. 1A and 1B.

In a display device 10B shown in FIG. 3, the porous electrode sheet 1 and the display substrate 11 are disposed so as to sandwich an electrochromic layer 14. More specifically, the transparent electrode 3 of the porous electrode sheet 1 is in contact with the electrochromic layer 14 disposed on the display substrate 11, and the resin film 2 faces the space filled with the electrolyte 19.

With this configuration, a transparent electrode need not be formed on the display substrate 11 which is an outer barrier layer. Therefore, a flexible barrier film such as a plastic film can be used as the display substrate 11. In the case of the conventional display device, when a space between the display substrate and the counter electrode is sealed with a spacer at the position of the transparent electrode, a durability problem arises from the adhesiveness between the transparent electrode and the spacer. However, the use of the porous electrode sheet 1 can eliminate the need of the transparent electrode on the display substrate 11, and thus allows adhesion between the same or similar materials, resulting in a good durability.

EXAMPLES

Hereinafter, the present invention will be described in detail with reference to examples. However, the present invention is not limited by these examples in any respect.

A commercially-available product (Oxydisk manufactured by Oxyphen AG) having a thickness of 13 µm and provided with through holes having an average hole diameter of 10 µm was prepared as a transparent insulating resin film. One face of the resin film was sputtered with ITO using a batch-type sputtering device (SMH-2306RE manufactured by ULVAC, Inc.), to form a transparent electrode. The ultimate vacuum in the sputtering was set to $1\times10^{-5}$ Torr, and the sputtering was performed with a voltage of 430 V and a current of 0.88 A for 5 minutes in an atmosphere with a process pressure of $4.3\times10^{-3}$ Torr while Ar and $O_2$ were being supplied into the atmosphere at 40 sccm and 3 sccm, respectively. Thus, a porous electrode sheet was obtained.

The surface of the transparent electrode of the obtained porous electrode sheet was observed with an electron microscope at a magnification of 1000. It was found that openings were formed in the transparent electrode at positions corresponding respectively to the through holes of the resin film.

In addition, the surface resistivity of the transparent electrode of the obtained porous electrode sheet was measured using a resistivity meter (Loresta-GP MCP-T610 manufactured by Mitsubishi Chemical Corporation) having an ASP probe. The surface resistivity was 60Ω/□ at a voltage of 10 V.

A similar result was obtained also in the case where the resin film used was a commercially-available product (Oxydisk manufactured by Oxyphen AG) having a thickness of 22 µm and provided with through holes having an average hole diameter of 1.0 µm.

The invention claimed is:

1. A display device, comprising:
   a porous electrode sheet comprising:
      a transparent resin film having insulating properties, the resin film being provided with a plurality of through holes extending linearly from one face of the resin film to the other face; and
      a transparent electrode placed on the one face of the resin film and having openings at positions corresponding respectively to the plurality of through holes;
   an electrochromic layer provided in contact with the transparent electrode of the porous electrode sheet; and
   an address electrode facing the porous electrode sheet across a space filled with an electrolyte.

2. A method for producing a porous electrode sheet, the method comprising the steps of:
   forming a plurality of modified tracks by irradiating a resin base material that is transparent and imperforate with an ion beam so that the plurality of modified tracks extend in such a way as to penetrate the resin base material in a thickness direction;
   obtaining a resin film having a plurality of through holes by subjecting the resin base material to chemical etching using the modified tracks as base points; and
   forming, on one face of the resin film, a transparent electrode having openings at positions corresponding respectively to the plurality of through holes.

* * * * *